United States Patent
Kroehnert et al.

(10) Patent No.: US 7,518,220 B2
(45) Date of Patent: Apr. 14, 2009

(54) SUBSTRATE FOR AN FBGA SEMICONDUCTOR COMPONENT

(75) Inventors: Steffen Kroehnert, Dresden (DE); Knut Kahlisch, Dresden (DE); Wieland Wahrmund, Dresden (DE)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 11/338,867

(22) Filed: Jan. 24, 2006

(65) Prior Publication Data

US 2006/0180929 A1 Aug. 17, 2006

(30) Foreign Application Priority Data

Jan. 24, 2005 (DE) ................. 10 2005 003 390

(51) Int. Cl.
*H01L 23/495* (2006.01)
(52) U.S. Cl. ...................... 257/676; 257/787
(58) Field of Classification Search ........... 257/787, 257/698, 676, 666
See application file for complete search history.

(56) References Cited

U.S. PATENT DOCUMENTS

| | | | |
|---|---|---|---|
| 5,336,931 A * | 8/1994 | Juskey et al. ............ 257/787 |
| 5,367,191 A * | 11/1994 | Ebihara ................... 257/666 |
| 5,674,785 A | 10/1997 | Akram et al. |
| 5,722,161 A | 3/1998 | Marrs |
| 6,011,301 A * | 1/2000 | Chiu ...................... 257/678 |
| 6,013,946 A | 1/2000 | Lee et al. |
| 6,247,229 B1 * | 6/2001 | Glenn ..................... 29/841 |
| 6,455,356 B1 * | 9/2002 | Glenn et al. ............. 438/123 |
| 6,724,076 B1 | 4/2004 | Kahlisch et al. |
| 6,818,989 B2 | 11/2004 | Higuchi et al. |
| 7,042,068 B2 * | 5/2006 | Ahn et al. ............... 257/666 |
| 2003/0025185 A1 | 2/2003 | Chye et al. |
| 2004/0104408 A1 | 6/2004 | Moden et al. |
| 2005/0098870 A1 | 5/2005 | Thomas et al. |

FOREIGN PATENT DOCUMENTS

DE 196 18 101 A1 11/1997
DE 199 54 888 A1 5/2001

* cited by examiner

*Primary Examiner*—Roy K Potter
(74) *Attorney, Agent, or Firm*—Slater & Matsil, L.L.P.

(57) ABSTRACT

An FBGA semiconductor component has a chip side for receiving a semiconductor chip, a solder ball side for applying solder balls on ball pads, and a bonding channel embodied as an opening between the chip side and the solder ball side and serving for leading through wire bridges between the semiconductor chip and bonding islands on the solder ball side. The bonding channel has side areas extending between the chip side and the solder ball side and can be closed off with a housing part comprising potting composition. Positively locking elements for a potting composition are arranged in that region of the substrate in which the housing part is produced.

16 Claims, 4 Drawing Sheets

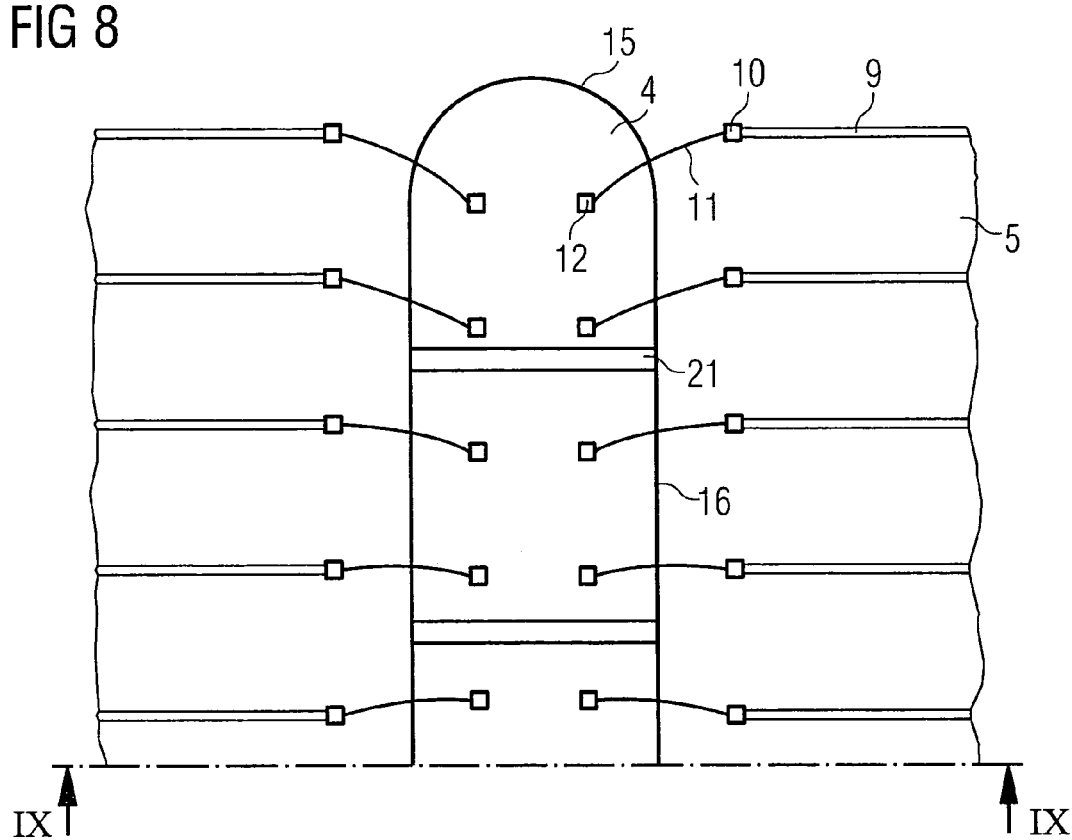
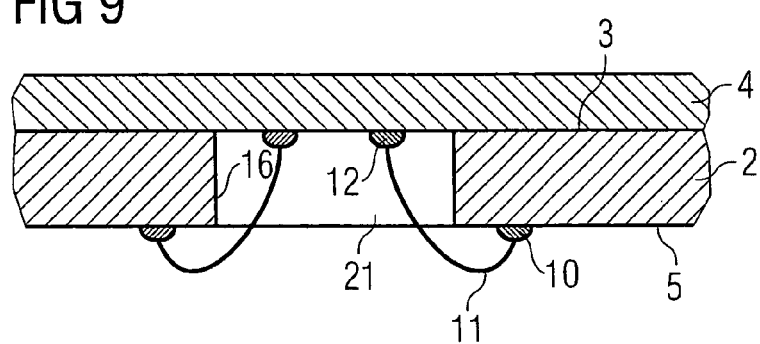

SUBSTRATE FOR AN FBGA SEMICONDUCTOR COMPONENT

This application claims priority to German Patent Application 10 2005 003 390.3, which was filed Jan. 24, 2005, and is incorporated herein by reference.

TECHNICAL FIELD

The invention relates to a substrate for an FBGA semiconductor component.

BACKGROUND

Semiconductor chips are usually mounted to form semiconductor components for protection against external influences, for mechanical stabilization and for connection to an external circuit. So-called FBGA semiconductor components are known in this case. In this case, "FBGA" stands for "Fine Ball Grid Array," which means that small solder balls are arranged in gridlike fashion in an array on a solder ball side of a substrate.

The small solder balls are fixed on ball pads. The ball pads are part of a conductor structure that serves for the electrically conductive connection to bonding pads. The conductor structure with its ball pads and the bonding pads is usually likewise arranged on the solder ball side of the substrate. The semiconductor chip or a stack of semiconductor chips is or are situated on the chip side of the substrate opposite to the solder ball side. In this case, the semiconductor chip (the bottommost semiconductor chip in the case of stacks of semiconductor chips) is placed by its patterned side onto the chip side of the substrate and fixed there. For the electrically conductive connection between the semiconductor chip and the bonding pads, on the one hand bonding pads are likewise provided on the semiconductor chip, these bonding pads quite generally being arranged in the center of the semiconductor chip. Situated precisely in this region there is an opening in the substrate, this opening being called a bonding channel. The opening generally has a rectangular form in plan view. Short wire bridges are then drawn from the bonding pads on the semiconductor chip to the bonding pads of the conductor structure and are each fixedly bonded to the bonding pads.

For mechanical stabilization, it is then provided that the semiconductor chip or the semiconductor chip stack is provided with a first housing part and the bonding channel is provided with a second housing part. These housing parts are produced by placing onto the substrate potting tools that have the negative mold of the housing parts to be formed. A potting composition is pressed into these negative molds and then cures. After removal of the potting molds, the housing parts have thus been produced.

The bonding channel has side areas extending between the solder ball side and the chip side. The side areas are usually configured such that they are relatively smooth. It is thus only possible for the potting composition of the second housing part in the bonding channel to form a materially cohesive connection.

This materially cohesive connection has proved to be disadvantageous to the effect that fractures very often occur in this housing part. These housing fractures lead to fractures or tears of the bonding wires in each case in the region of the housing fracture. The consequence of this is that the semiconductor components have an excessively low reliability and thus do not meet the quality requirements.

One possibility for mechanical stabilization of the housing is afforded by reinforcing the housing, either by increasing the thickness or increasing the width. Increasing the thickness is limited by the fact that the solder balls have a small diameter and the height of the housing part must be less than the size of the solder ball diameters. Limits are imposed on the width of the bonding channels since these will have to be made even smaller in view of the object of further miniaturization in the future.

The problem of housing fracture and low reliability has been combated hitherto by searching for suitable materials, which has led to the expensive development of new materials for minimizing stress. This demand for the use of "universal" materials, that is to say those that can be utilized for entire technology platforms, exhibits a very high expenditure in terms of costs and time.

Another possibility has been sought in changing the housing construction, e.g., in the size and thickness of the adhesive between the semiconductor chip and the substrate or changing the chip and substrate thickness.

SUMMARY OF THE INVENTION

Consequently, in one aspect, the invention avoids a housing fracture with a low expenditure in terms of time and costs and thus increases the reliability of FBGA semiconductor components.

According to embodiments of the invention, positively locking elements for a potting composition are arranged in that region in which the housing part is produced. By virtue of these positively locking elements, a positively locking joint is also effected in addition to the previously acting materially cohesive joint and thus on the one hand the stability of the housing part is increased and on the other hand the connection of the housing part to the substrate is improved. By virtue of this additional positively locking joint, a housing fracture and thus a fracture or a tearing-away of the wire bridges are effectively prevented, as a result of which the reliability of FBGA semiconductor components is increased.

In one configuration of the invention, it is provided that the positively locking elements are formed in the form of depressions on the solder ball side alongside the bonding channel. As a result of emplacing the potting tool, potting material that is joined together with the housing will then also penetrate into the depressions and thus produce a positively locking joint. This form of the configuration of the invention is suitable by virtue of the fact that the depressions can be introduced very simply from the solder ball side.

In one embodiment in this respect, it is provided that the depressions are formed as grooves running around the bonding channel. A maximum mechanical stability is obtained by virtue of this peripheral groove.

It is furthermore advantageous to impart an additional positively locking joint on the grooves by virtue of the latter being formed in T-shaped fashion or in dovetailed fashion in their cross section. In another embodiment of the invention, it is provided that the positively locking elements are arranged in the bonding channel. This configurational form has the advantage that for this purpose it is possible to utilize the space present anyway in the bonding channel for increasing the positively locking joint.

In an expedient embodiment in this case, an undercut is at least partly introduced into the side areas of the bonding channel. This is done in such a way that the side areas form an angle of less than 90° with the solder ball side in the regions of the undercut. Conversely, in these regions the angle between the side area and the chip side will be greater than 90°. A larger space is thus present on the chip side in these regions for the casting material, so that potting material that penetrates from the solder ball side is distributed behind the oblique side areas. A higher positively locking joint is thus provided.

Another possibility for producing a positively locking joint consists in introducing grooves in the side areas. The grooves have the advantage that they increase the strength both in the two perpendicular directions with respect to the substrate surfaces and in the lateral direction. The positively locking joinability in the lateral direction can furthermore be increased by virtue of the fact that the grooves are embodied in T-shaped or dovetailed fashion in cross section.

Normally, the side areas are even configured in very clean and smooth fashion by means of an additional processing step. By contrast, in a further embodiment of the invention, it is provided that the side areas are deliberately provided with unevennesses. This may be done for example by a procedure in which the bonding channel is stamped out from the substrate material during production and the torn edges arising during the stamping operation are not eliminated, but rather are deliberately left in order thus to increase the positively locking joint between the potting material and the side areas.

A further configuration of the invention provides for a web to be arranged between one side of the side areas and a second side area lying opposite in the bonding channel, which web is fixedly connected to the substrate on each side. The web constitutes an additional component, which on the one hand increases the positively locking joint between the potting material and the substrate and on the other hand also increases the stability of the substrate material itself. There is thus a mechanical connection between the individual substrate parts, which makes it more difficult for the substrate to be warped or bent and thus prevents a fracture of the housing part or the housing from being torn from the bonding channel.

For this purpose, it is possible for the web to extend over the bonding channel on the solder ball side and to be fixedly connected to the edge of the bonding channel. In this way, it is possible to introduce the web after the mounting of the chip and, if appropriate, even after the production of the wire connections between the bonding pads of the semiconductor chip and the bonding pads on the solder ball side, for which reason the web does not have a disturbing effect on the bonding process.

It is also possible, of course, for the web to be designed beforehand such that it does not impede the bonding process. In this case, it is possible for the web to extend from one side of the bonding channel to an opposite side of the bonding channel and in each case to be connected to the side areas. The advantage with this configuration is that the web does not then form an elevation above the bonding channel, which might possibly be disturbing.

In a further configuration in this respect, it is provided that the web occupies the height of the bonding channel between the solder ball side and the chip side. The full height of the bonding channel is thus utilized and the web can manifest its maximum effect.

In particular for facilitating the bonding operation, it may be expedient, however, if the web only partly occupies the height of the bonding channel between the solder ball side and the chip side and is then arranged near to the chip side.

In order to further increase the mechanical stability and in order to increase the positively locking joint between the potting composition and the substrate, it is possible to arrange a plurality of webs.

In this case, it is expedient to arrange these webs parallel to one another since they can then take up the forces in uni- formly distributed fashion in the direction in which they run parallel and the effects of the individual webs cumulate in the perpendicular direction with respect thereto.

BRIEF DESCRIPTION OF THE DRAWINGS

The invention will now be explained in more detail on the basis of exemplary embodiments. In the associated drawings:

FIG. 8 shows a partial view on the solder ball side with webs between the sidewalls; and FIG. 9 shows a partial cross section through the bonding channel along the line IX-IX in FIG. 8.

The following list of reference symbols can be used in conjunction with the figures:

| | |
|---|---|
| 1 | FBGA semiconductor component |
| 2 | Substrate |
| 3 | Chip side |
| 4 | Semiconductor chip |
| 5 | Solder ball side |
| 6 | Solder ball |
| 7 | Soldering resist mask |
| 8 | Ball pad |
| 9 | Conductor structure |
| 10 | Bonding pad on the solder ball side |
| 11 | Wire bridge |
| 12 | Bonding pad on the semiconductor chip |
| 13 | Housing part on the semiconductor chip |
| 14 | Housing part over the bonding channel |
| 15 | Bonding channel |
| 16 | Sidewall |
| 17 | Fracture |
| 18 | Groove around the bonding channel |
| 19 | Groove in the sidewall |
| 20 | Unevenness |
| 21 | Web |
| α | Angle |
| β | Angle |
| A | Enlarged detail |

DETAILED DESCRIPTION OF ILLUSTRATIVE EMBODIMENTS

Figure 1:
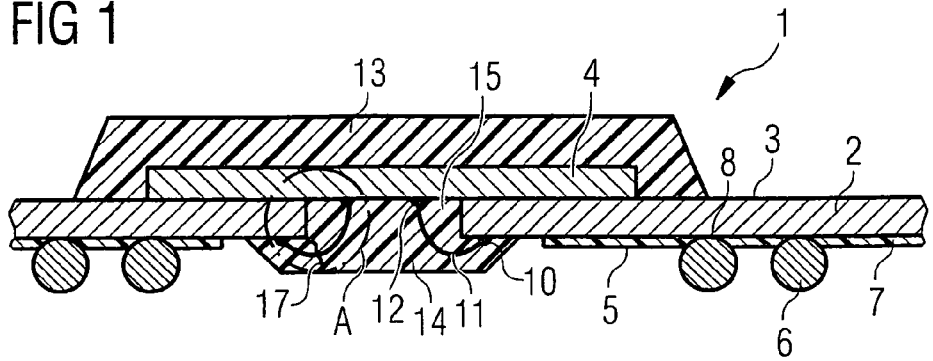
FIG. 1 shows a cross section through an FBGA semiconductor component according to the prior art.

As illustrated in FIG. 1, an FBGA semiconductor component 1 contains a substrate 2. A semiconductor chip 4 is mounted on the chip side 3. The substrate 2 is provided with solder balls 6 on a solder ball side 5. In order to prevent solder from flowing away from the solder balls 6, a soldering resist mask 7 is furthermore applied to the solder ball side 5.

Figure 4:
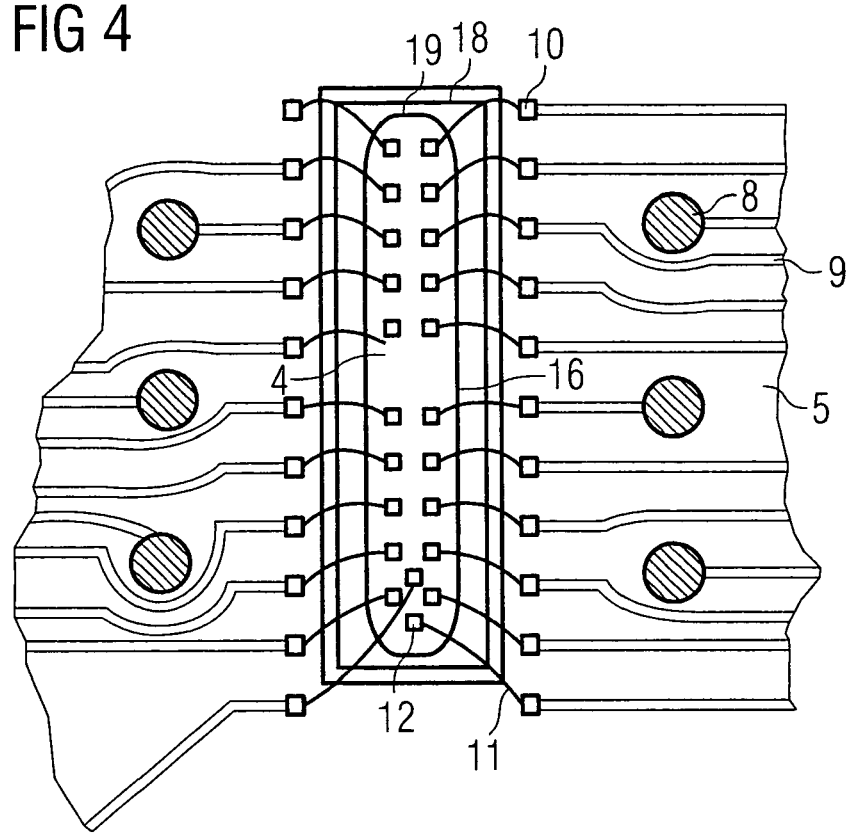
FIG. 4 shows a view of the bonding channel from the solder ball side with a peripheral groove.

The solder balls 6 are fixed on ball pads 8. The ball pads 8 are electrically conductively connected to bonding pads 10 on the solder ball side 5 via a conductor structure 9 (shown in FIG. 4). For connecting the semiconductor chip 4 to the conductor structure 9, the bonding pads 10 are connected to bonding pads 12 on the semiconductor chip via wire bridges 11. For mechanical stabilization and for protection, the FBGA semiconductor component 1 is provided with a housing part 13, which covers the semiconductor chip 4, and with a housing part 14, which fills the bonding channel 15.

Figure 2:
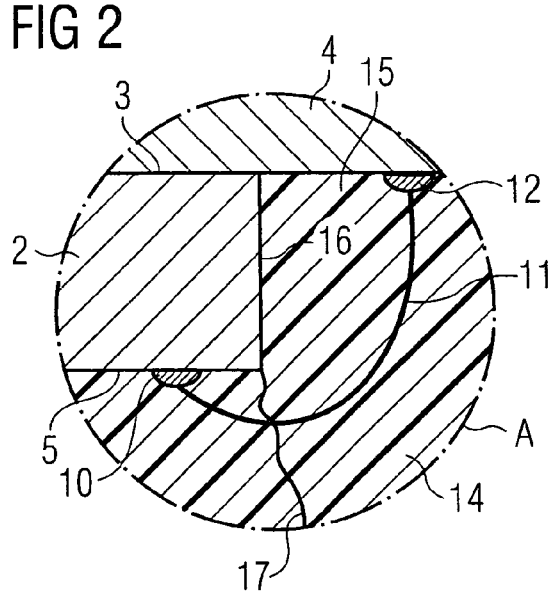
FIG. 2 shows a detail A from FIG. 1 according to the prior art.

As illustrated in FIG. 1, the bonding channel 15, through which the wire bridges 11 are drawn, has smooth sidewalls 16. By virtue of this mechanical configuration, the housing part 14 is connected to the substrate 2 only in materially cohesive fashion. However, there is a positive locking joint between the housing part 14 and the wire bridge 11 since the housing part 14 encapsulates the wire bridge 11. On account of this inadequate connection between the housing part 14 and the substrate 2, a fracture 17 very often occurs in the housing part 14, as illustrated in FIG. 2. This fracture 17 runs over the wire bridge 11, which regularly leads to a fracture of the wire of the wire bridge 11.

Figure 3:
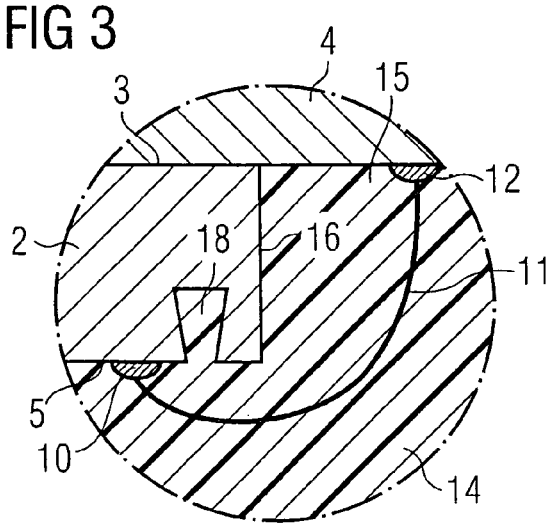
FIG. 3 shows the detail A in a configuration according to the invention with a groove running around the bonding channel.

A positively locking connection between the housing part 14 and the substrate 2 provides a remedy here. This is realized in a first exemplary embodiment in accordance with FIGS. 3 and 4 by virtue of the fact that a groove 18 running around the bonding channel 15 is introduced on the solder ball side 5, the groove being embodied in dovetailed fashion in cross section. In this dovetailed groove 18, during the shaping of the housing part 14, potting material can then pour into the groove 18 and the potting material in the groove then produces a positively locking connection between the substrate 2 and the housing part 14, thereby effectively avoiding a fracture 17 of the kind illustrated in FIG. 2.

Figure 5:
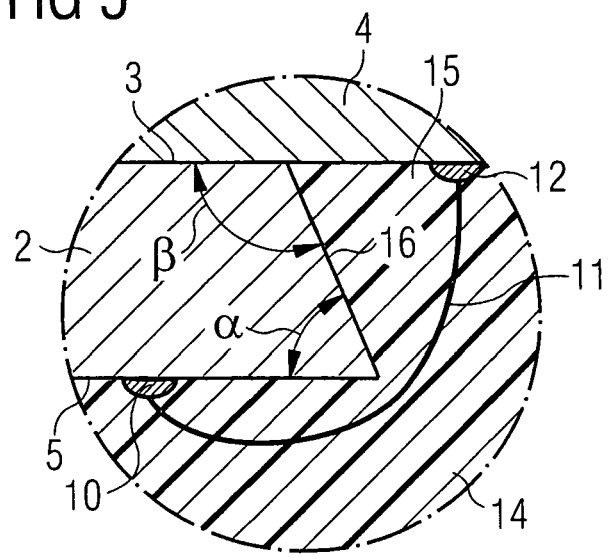
FIG. 5 shows a configuration of an undercut according to the invention corresponding to the detail A.

FIG. 5 shows another configuration of the sidewall 16 of the bonding channel 15 in an undercut. In this case, the solder ball side 5 forms an angle α of less than 90° with the sidewall 16. The sidewall 16 correspondingly forms an angle β of less than 90° with the chip side 3. Accordingly, on the chip side 3 a larger space exists for the potting material of the housing part 14, as a result of which the housing part 14 is held in positively locking fashion in the substrate 2.

Figure 6:
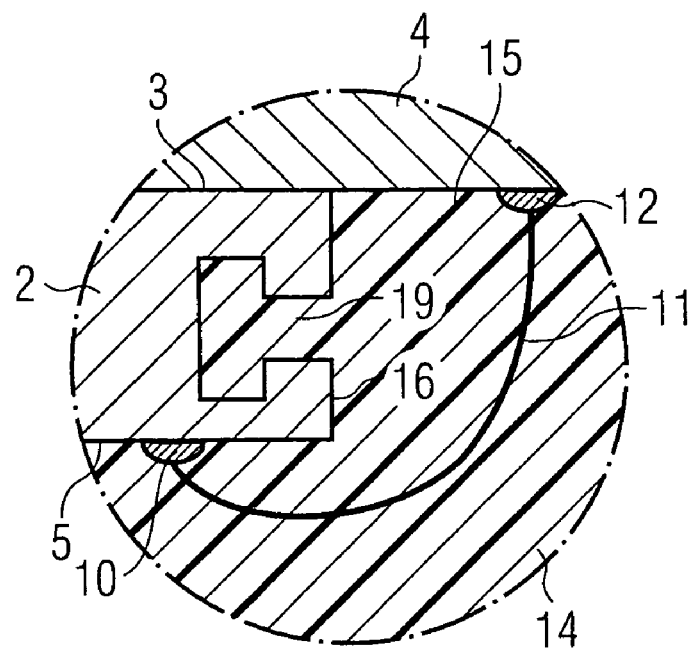
FIG. 6 shows a configuration according to the invention corresponding to the detail A with a groove in the sidewalls.

A further possibility for producing a positively locking joint between the housing part 14 and the substrate 2 consists in introducing a groove 19 into the sidewall 16, which groove, as illustrated in FIG. 6, is formed in T-shaped fashion. Potting material is introduced into this groove 19, too, during the production of the housing part 14, and it then provides for the positively locking connection.

Figure 7:
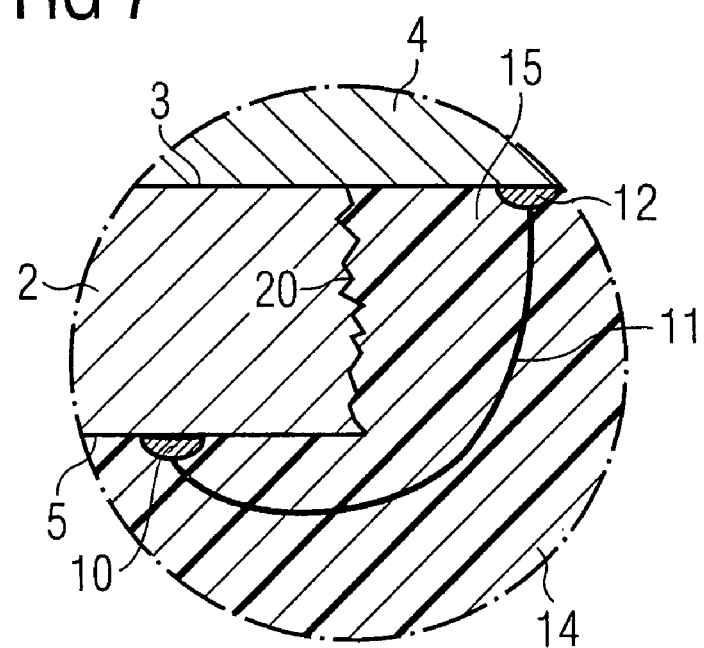
FIG. 7 shows a configuration of the detail A according to the invention with unevennesses in the sidewalls.

A further possibility for realizing a positively locking joint between the housing part 14 and the substrate 2 consists, in accordance with FIG. 7, in providing the sidewall 16 with an unevenness 20. This can be done in an extremely simple manner by a procedure in which, when the bonding channel 15 is stamped out, the resulting roughness of the sidewalls 16 is not eliminated. This saves a technological step, on the one hand, and considerably improves the positively locking joinability, on the other hand.

A further possibility for producing a positively locking joint and stabilizing the bonding channel 15 is illustrated in FIGS. 8 and 9, in which a web 21 is introduced between the two sides in the longitudinal extent of the bonding channel 15, the web being mechanically fixedly connected to the sidewalls 16. As can be seen, the web 21 extends over the height of the bonding channel 15, that is to say between the chip side 3 and the solder ball side 5. The web 21 is expediently arranged such that it lies between the wire bridges 11 and, consequently, does not impede the bonding operation, that is to say the production of the wire bridges between the bonding pads 10 and 12.

What is claimed is:

1. A semiconductor component comprising:
    a substrate having a chip side, a solder ball side, and a bonding channel;
    a semiconductor chip mounted on the chip side of the substrate;
    a plurality of solder ball pads disposed on the solder ball side of the substrate;
    a plurality of electrical connections extending through the bonding channel and electrically connected between the semiconductor chip and the solder ball pads; and
    an encapsulation material covering the electrical connections within the bonding channel, wherein the encapsulation material extends within a surface of the substrate, and wherein the surface of the substrate includes at least one depression on the solder ball side adjacent the bonding channel, the encapsulation material extending within the depressions, wherein the at least one depression comprises at least one groove running around the bonding channel.

2. The semiconductor component according to claim 1, wherein the grooves have a T-shaped or dovetailed cross section.

3. A semiconductor component comprising:
    a substrate having a chip side, a solder ball side, and a bonding channel;
    a semiconductor chip mounted on the chip side of the substrate;
    a plurality of solder ball pads disposed on the solder ball side of the substrate;
    a plurality of electrical connections extending through the bonding channel and electrically connected between the semiconductor chip and the solder ball pads; and
    an encapsulation material covering the electrical connections within the bonding channel, wherein the encapsulation material extends within a surface of the substrate, and wherein encapsulation material extends within a surface of the substrate along edges of the bonding channel, wherein the edges of the bonding channel include a groove, the encapsulation material extends within the groove, and the groove is T-shaped or dovetailed in cross section.

4. The semiconductor component according to claim 3, wherein the edges of the bonding channel include an undercut such that edges of the bonding channel form an angle of less than 90° with the solder ball side of the substrate.

5. The semiconductor component according to claim 3, wherein the edges of the bonding channel are uneven.

6. The semiconductor component comprising:
    a substrate having a chip side, a solder ball side, and a bonding channel;
    a semiconductor chip mounted on the chip side of the substrate;
    a plurality of solder ball pads disposed on the solder ball side of the substrate;
    a web arranged between a first sidewall of the bonding channel and a second sidewall of the bonding channel, the web attached to the substrate at each sidewall;
    a plurality of electrical connections extending through the bonding channel and electrically connected between the semiconductor chip and the solder ball pads; and
    an encapsulation material covering the electrical connections within the bonding channel.

7. A semiconductor component according to claim 6, wherein the web extends over the bonding channel on the solder ball side of the substrate.

8. The semiconductor component according to claim 6, wherein the web extends from one side of the bonding channel to an opposite side of the bonding channel and is in each case connected to the sidewalls.

9. The semiconductor component according to claim 8, wherein the web occupies the height of the bonding channel between the solder ball side and the chip side.

10. The semiconductor component according to claim 8, wherein the web only partly occupies the height of the bonding channel between the solder ball side and the chip side and is arranged near to the chip side.

11. The semiconductor component according to claim 6, wherein a plurality of webs are arranged over the bonding channel.

12. The semiconductor component according to claim 11, wherein the plurality of webs are arranged parallel to one another.

13. The semiconductor component of claim 6, wherein a surface of the substrate comprises at least one recess and the encapsulation material extends within the recess.

14. A substrate having a chip side for receiving a semiconductor chip, a solder ball side for applying solder balls on ball pads, and a bonding channel embodied as an opening between the chip side and the solder ball side and serving for leading through wire bridges between the semiconductor chip and bonding islands on the solder ball side, wherein said bonding channel has side areas extending between the chip side and the solder ball side and can be closed off with a housing part comprising potting composition, wherein the substrate includes at least one positively locking element for a potting composition that is arranged in that region of the substrate in which the housing part is produced, and wherein the at least one positively locking element comprises a web that extends across the bonding channel.

15. The semiconductor component according to claim 3, wherein sidewalls of the edges of the bonding channel are uneven.

16. The semiconductor component according to claim 3, wherein encapsulation material extends within a surface of sidewalls of the substrate along edges of the bonding channel.

* * * * *